United States Patent [19]

Faith, Jr.

[11] 4,302,498
[45] Nov. 24, 1981

[54] LAMINATED CONDUCTING FILM ON AN INTEGRATED CIRCUIT SUBSTRATE AND METHOD OF FORMING THE LAMINATE

[75] Inventor: Thomas J. Faith, Jr., Lawrenceville, N.J.

[73] Assignee: RCA Corporation, New York, N.Y.

[21] Appl. No.: 201,438

[22] Filed: Oct. 28, 1980

[51] Int. Cl.$^3$ .................. C23C 13/02; C23C 13/04
[52] U.S. Cl. ............................ 428/209; 204/192 C;
204/192 SP; 427/42; 427/45.1; 427/99;
427/124; 427/126.4; 427/255.3; 428/215;
428/216; 430/313; 430/319
[58] Field of Search ............ 427/99, 81, 255.3, 255.7,
427/250, 124, 126.4, 42, 45.1; 204/192 C, 192
SP; 428/209, 215, 216

[56] References Cited

PUBLICATIONS

Springer et al., Thin Solid Films, 54 (1978), pp. 197-205.
Springer et al., J. Vac. Sci. Technol., vol. 17, No. 1 (1978), pp. 437-440.
Mechanical Properties of Thin Films, Handbook of Thin Film Technology, Ed., Maissel and Glang, Chapter 12, p. 36.
Springer et al., Applied Vacuum Science & Technology Digest Report, 9th Annual Symposium, Applied Vac. Sci. Tech., Feb. 11-13.
Blatt, Applied Physics Letters, vol. 19, #2, pp. 30-33.

*Primary Examiner*—Ralph S. Kendall
*Attorney, Agent, or Firm*—Birgit E. Morris; Donald S. Cohen; Joseph D. Lazar

[57] ABSTRACT

A method in integrated circuit technology of depositing an adherent aluminum film that does not develop significant protrusions, such as "hillocks" and "whiskers", during or following annealing. The aluminum is deposited by evaporation or sputtering techniques while sufficient dry oxygen is introduced periodically into the deposition chamber to form alernating layers of aluminum and oxygen-doped aluminum consisting of no more than 10 atomic percent oxygen. Photolithographically patterning such a laminated film into the appropriate configuration of conducting lines and bond pads, and subsequently annealing such as a laminated film at temperatures from 450° C. to 560° C. in forming gas, results in aluminum surfaces that are free of protrusions with heights above 0.5 μm and in films that have relatively low resistivity, i.e., resistivity that is less than 1.8 times the resistivity of bulk aluminum. The laminated films range in thickness between 8000 to 25,000 angstroms. The top layer is formed of aluminum with a thickness no less than about 1500 angstroms and no more than about 3000 angstroms.

15 Claims, 4 Drawing Figures

LAMINATED CONDUCTING FILM ON AN INTEGRATED CIRCUIT SUBSTRATE AND METHOD OF FORMING THE LAMINATE

BACKGROUND OF THE INVENTION

This invention relates to a method of metallizing integrated circuits with aluminum.

It is common for protrusions to form on the surface of thin metal film, particularly where a soft metal with a high coefficient of thermal expansion is deposited on a substrate with a significantly lower thermal expansion coefficient. Such a suituation exists in the case of aluminum integrated-circuit metallizations deposited on thermally-oxidized silicon, the thermal expansion coefficients of aluminum, silicon and $SiO_2$ being $2.4 \times 10^{-5}$, $2.5 \times 10^{-6}$, and $5.0 \times 10^{-7}$ $°C.^{-1}$, respectively. Protrusions usually appear on the aluminum film surface after the high-temperature alloying process which establishes ohmic contact between aluminum and silicon in the circuit's contact cuts (also known as contact openings). The contact cuts as known in the art are developed by pattern etching the thermally oxidized silicon by photolithographic processes and the like. The combination of the high compressive stress induced by the mismatch in expression coefficients, and the low yield strength of aluminum at alloying temperatures (usually greater than 450° C.) causes the film to yield, forming local protrusions at grain-boundary intersections which can reach heights greater than the film's thickness, typically one micrometer ($\mu$m). The most common protruding form is the "hillock", a faceted, roughly pyramidal structure whose cross-section decreases with distance from its base. Another form, which looks like a short, fat "whisker", is also occasionally encountered.

Hillocks and whiskers are particularly troublesome in post-alloy integrated-circuit processing. The phosphosilicate-glass (PSG) overcoat typically deposited after metal alloying follows the contours of the hillocks. When photoresist is spun on in preparation for etching away the PSG from bond-pad areas, it often fails to cover the PSG at hillock sites. Consequently, the PSG is etched at such sites and aluminum is exposed, thereby creating a potential corrosion problem. Attempts to solve this problem have included: (1) application of a second photoresist coating before optical exposure of the first coating, or (2) application, exposure and development of a second coating after exposure, development and hard-backing of the first coating. These solutions have not been wholly satisfactory. A substantially protrusion-free metallization would elimate the need for such extra steps. A substantially protrusion-free surface for the purposes of this disclosure shall be understood to be that in which hillocks, etc., have a height less than 0.5 $\mu$m. Applications may require a different criterion of what is protrusion free. Nevertheless, it should be understood that there is no purpose served in providing a perfectly smooth surface that is literally protrusion-free.

Aluminum hillock growth has been inhibited by the addition of alloying elements such as copper and silicon. However, copper increases the film's susceptibility to corrosion, and silicon adds to the complexity of film processing and properties. An alloy of aluminum and silicon (Al-Si) often requires an additional process step, i.e., "freckle etching" after metal pattern definition, to remove the silicon precipitates (so-called "freckles") from the $SiO_2$ surface. These precipitates also represent a potential process-control problem, large variations in precipitate size and density having been observed in patterned metallizations on wafers which had experienced "identical" processing conditions. Large wafer-to-wafer variations in Al-Si etch rate for wafers within the same deposition run have been observed, and severe bondability problems have been periodically encountered.

Given these deficiencies, a system in which the added element is tightly bonded to the aluminum could provide an attractive alternative to aluminum, Al-Si and Al-Cu in many applications provided that (1) the additive element can be introduced in a controlled and reproducible manner, (2) the addition can be accomplished in existing deposition systems without major system modification or complication (3) the resulting film has low resistivity i.e. less than approximately twice the resistivity of bulk aluminum, and (4) the film is significantly less susceptible to hillock growth than aluminum films. Such applications would include (1) circuits requiring high ($\geq 500°$ C.) alloying temperatures and (2) circuits which incorporate two separate levels of aluminum-based interconnects.

Aluminum films deposited under typical vacuum-system conditions (without deliberate addition of oxygen) contain on the order of one tenth of a percent oxygen. This oxygen, the source of which is the residual water vapor in the vacuum system, is probably helpful in reducing the stress in the as-deposited film and consequently in improving film adhesion to the integrated-circuit substrate. Since oxygen forms strong bonds with aluminum, it is also expected to be stable against the gross solute redistribution and precipitation which occur in Al-Si and Al-Cu alloy systems during post-desposition processes. Al-O films, i.e., films in which oxygen is deliberately added, have been shown to provide significant increases in resistance to electromigration in bipolar integrated circuits. See an article by H. J. Bhatt, entitled "Superior Aluminum For Interconnections Of Integrated Circuits", Applied Physics Letters 19, 30 (1971) which reports that such films containing $Al_2O_3$ either did not form hillocks, or formed very few, smaller hillocks. Bhatt described depositing aluminum films with oxygen supplied during the entire time of deposition whereby a single layer of such a mixture is deposited.

Recently, a pulsed gas process has been developed to deposit high-strength, free-standing, thick (20–35 $\mu$m), layered Al/Al$_x$O$_y$ foils. This process is described by R. W. Springer and D. S. Catlett in a paper entitled "Structure and Mechanical Properties of Al/Al$_x$O$_y$ Vacuum Deposited Laminates", Thin Solid Films 54 (1978), pp. 197–205. In particular, the Springer paper teaches the production of high strength foils through the lamination of aluminum and aluminum oxide layers, the entire foil having an overall thickness of 20 micrometers (200,000 angstroms) and thicker. The objective of the laminate structure described by Springer requires a high oxygen content for the Al$_x$O$_y$ layers indicating that the experimentally achieved oxygen content in the order of 5 to 10% would have to be further increased to realize the full high-strength potential of the foil. Further discussions of this process of Springer et al. are presented in the J. Vacuum Sci. Technol., Vol 17, No. 1, January/February 1980, pp. 437–440 in an article entitled "Quantitative Characterization of High Strength Aluminum Foils Vapor Deposited on Curved Surfaces." A still further discussion of this process was included in a paper presented at the 9th Annual Symposium of the Applied Vacuum Science and Technology at Tampa, Florida on February 11-13, 1980. An abstract of the paper published on page 15 of the proceedings indicates that the laminate of thick aluminum foils were fabricated having thicknesses of 20 microns (200,000 angstroms).

A discussion of the internal stress in evaporated films is made in the *Handbook of Thin Film Technology*, Ed., Maissel and Glang, McGraw Hill, 1970, Chapter 12, page 36, with particular reference to Turner for his work using materials in alternating layers with compressive and tensile stress to increase the total thickness to which optical coatings could be deposited from 6 to 40 micrometers.

SUMMARY OF THE INVENTION

According to this invention, a laminated conducting film is formed on an integrated-circuit substrate in a vacuum chamber by depositing a plurality of layers of aluminum on the substrate and periodically introducing dry oxygen into the chamber while depositing the aluminum to provide thereby a laminated film of alternate layers of aluminum and oxygen-doped aluminum. The oxygen content of the oxygen-doped aluminum layers consists generally of less than 10 atomic percent oxygen. The laminated film has a composite thickness in the range of 8000-25,000 angstroms, in which the top layer is aluminum having a thickness of no less than about 1,500 angstroms and no more than about to b 3,000 angstroms.

DETAILED DESCRIPTION OF THE PREFERRED EMBODIMENT

The invention is typically practiced in the metallization of integrated circuit wafers. Any of the known vacuum deposition systems may be used, under certain conditions as will be described. There are three general types of vacuum deposition systems which are widely used for metal deposition in integrated-circuit (IC) technology. First, there is a magnetron sputtering system operated in a vacuum which is back-filled with argon to a pressure of typically $2.5 \times 10^{-3}$ Torr. The second type of deposition is an electron beam (E-beam) evaporator operating at high vacuum, for example, at $5 \times 10^{-6}$ Torr. The third class of deposition systems comprise evaporators, also operating in high vacuum, in which the aluminum is evaporated from heated filaments or from rf heated crucibles.

Figure 1:
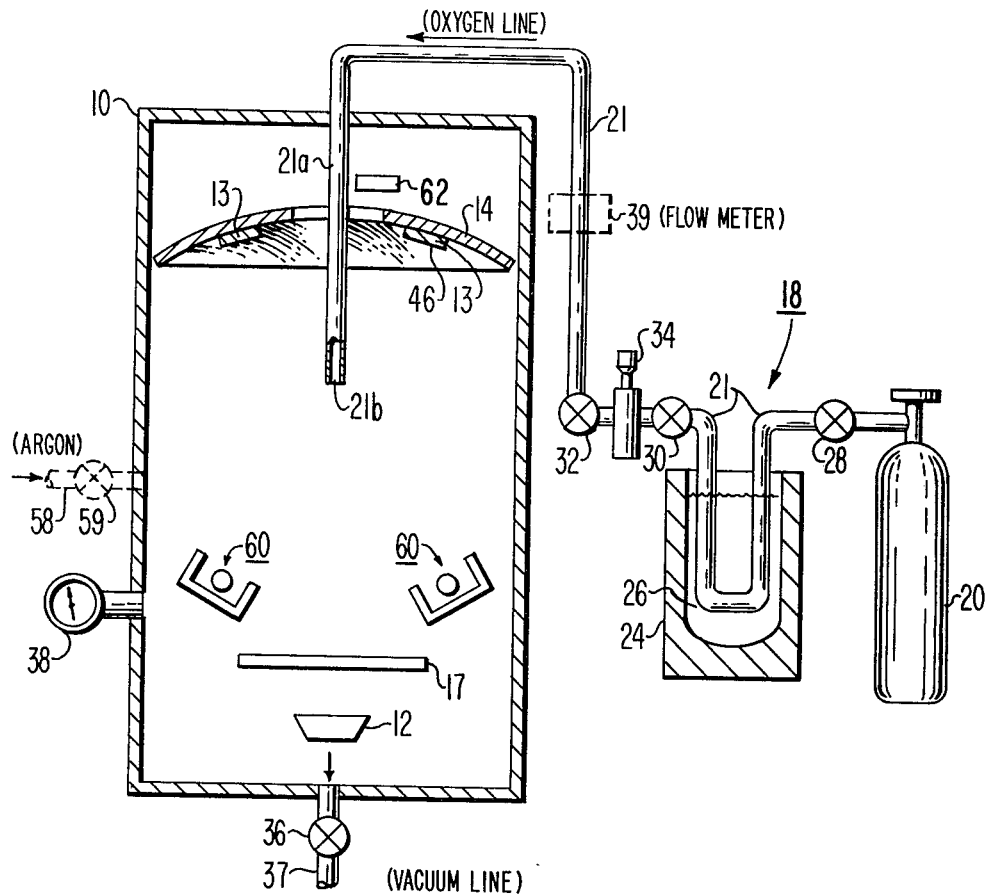
FIG. 1 is a schematic of one form of vacuum deposition apparatus useful in practicing the invention.

The apparatus illustrated in FIG. 1 typically represents any of the above enumerated deposition systems. A vacuum deposition chamber 10 is provided with a conventional source 12 of aluminum suitably positioned within the chamber. Suitable sources of aluminum include any of the known boats, strips, crucibles, helical coils, or sputtering targets suitably energized to provide an aluminum atom flux to the substrates. Substrates 13 are thermally oxidized silicon wafers with contact openings or cuts formed therein for access to the surface of the silicon material to which conductive contact is to be made. These substrates are disposed on a substrate holding fixture 14 preferably of the known planetary type adapted to be both rotated and revolved over the aluminum source 12. A suitable source of power, not shown, is provided to the apparatus as required to generate the flux or stream of aluminum atoms from the source 12.

A moveable shutter 17 is provided to interrupt the path of atoms from the source 12 to prevent deposition of the atoms of aluminum on the substrate 13 during warm-up cycles or any other steps of the process during which it is desired that no deposition on the substrate occurs.

An oxygen source apparatus 18 is provided to periodically introduce oxygen into the chamber during the process of depositing the aluminum on the substrates. Apparatus 18 includes a tank 20 containing oxygen which is conducted into the chamber 10 by an oxygen supply line 21 typically ¼" OD copper tubing connected to line 21a within the chamber 10 providing oxygen to the chamber through aperture 21b. Line 21 is passed through a cold trap 24 containing a suitable coolant 26, such as a dry ice and alcohol mixture. Oxygen flow is regulated by regulator 28 and needle valve 34. Shut off valves 30 and 32 in line 21 are provided to stop and start the flow of oxygen into the chamber 10. Valves 30 and 32 are preferably closely positioned adjacent to the needle valve 34 to regulate the flow of oxygen to the chamber in such a way as to prevent sudden bursts of oxygen after the pressure reduction is achieved by the needle valve 34. A vacuum line 37 coupled to vacuum pumps, not shown, provides means to exhaust the interior of chamber 10 by control valve 36. A Bayard-Alpert ion gauge 38 is provided to indicate (1) the pressure within the chamber and also (2) the oxygen fill pressure which is directly proportional to the oxygen flow rate from oxygen source 18 into the chamber 10. In the alternative, a flow meter 39 may be provided in the inlet line such as line 21 from the oxygen source into the chamber to measure directly the flow of oxygen into the chamber 10. Nevertheless, means is still needed to indicate the pressure within the chamber for vacuum control purposes and the like. Accordingly, the Bayard-Alpert ion gauge 38 is used for that purpose although any other convenient means to measure pressure may be used for this purpose. The manner of determining the pressure of a chamber and determining the flow rate of oxygen into a chamber are well known procedures in the art.

For apparatus which is to provide aluminum to the substrate by the sputtering technique, argon is required during the process. Accordingly, an inlet source 58 of argon is provided with a cut-off regulating valve 59.

Figure 2:
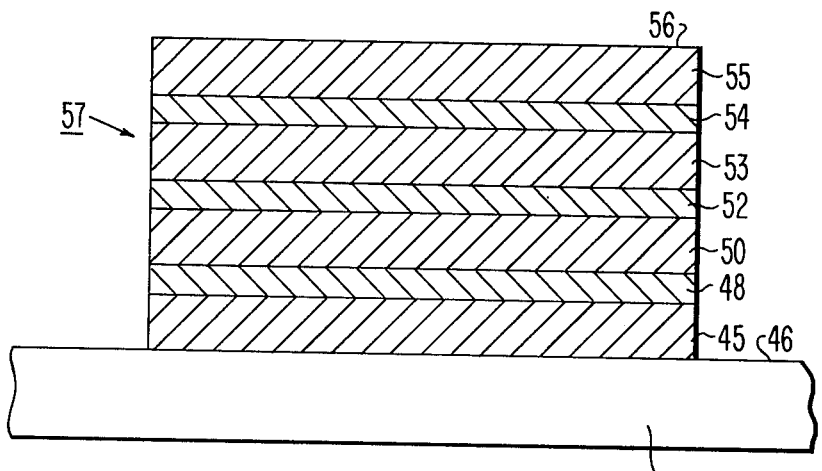
FIG. 2 is a sectional view of one example of a multilayered deposition of aluminum and oxygen-doped aluminum on a substrate according to the present invention.

In operation, aluminum atoms are provided from source 12 and deposited on the exposed surface 46 of substrates 13 as shown best in FIG. 2. After the first layer, i.e., the bottom layer 45, of aluminum is deposited on the surface 46 of the substrate 13, oxygen is introduced into chamber 10 from source 20 via lines 21, 21a and aperture 21b. The oxygen is preferably rendered dry via the cold trap 24. The oxygen molecules when introduced into chamber 10 during the time that the aluminum atoms are being deposited on the substrate 13, strike the surface of the growing aluminum film. A fraction of these molecules are adsorbed on the surface, reacting with the surface aluminum atoms to be incorporated into the layer. This process is continued during the time that the oxygen is flowing into the chamber. When the desired thickness of the film for layer 48 has been reached, the flow of oxygen is interrupted so that the aluminum atoms deposited on the surface develop thereby the next layer, namely layer 50, of pure aluminum. The oxygen that is incorporated into the aluminum layers by the process just described forms, it is believed, either aluminum oxide or simply aluminum doped with oxygen in what may be termed an oxygen bonded aluminum state. For the purposes of the present description the layers 48 etc. that include oxygen mixed with aluminum shall be termed "oxygen-doped aluminum." The rate of flow of oxygen into chamber 10 is controlled essentially by the operation and adjustment of needle valve 34. The flow of oxygen into chamber 10 is started or stopped by simultaneously opening or closing valves 30 and 32. Needle valve 34 together with valves 30 and 32 may be operated manually or, if desired, automatically by a programmed apparatus not shown.

The amount of oxygen introduced into the chamber can be calculated from the product of the oxygen fill pressure as measured by gauge 38 and the pumping speed of the system (determined by the vacuum pump). A suitable quartz-crystal film thickness monitor 62 may be used to determine the thickness of the films deposited on the substrate 13 during each step of the process.

Typically, oxygen is introduced into the chamber 10 with an oxygen fill pressure of $5 \times 10^{-6}$ to $1 \times 10^{-4}$ Torr to develop a flow rate of approximately $2 \times 10^{17}$ to $4 \times 10^{18}$ molecules of oxygen/sec.

When the desired thickness of layer 48 is reached, the oxygen is stopped from flowing into the chamber by simultaneously closing valves 30 and 32, and the aluminum continues to be deposited on the surface to deposit layer 50 of aluminum over the oxygen-doped aluminum layer 48. An additional layer 52 of oxygen-doped aluminum is provided over layer 50 by again introducing oxygen into the chamber 10 by simultaneously opening valves 30 and 32. Another cycle or pair of layers 53 and 54 is added in a similar fashion to develop an aluminum layer 53 and an oxygen-doped layer 54. A topping layer 55 of aluminum is then depsited on layer 54 by stopping the flow of oxygen into the chamber after the desired thickness of layer 54 is reached.

Thus, the laminated conducting film 57 illustrated in FIG. 2 is formed of seven layers comprising four alternate layers of aluminum (45, 50, 53 and 55) interleaved with three oxygen-doped layers of aluminum (48, 52 and 54). Such a structure 57 is formed, for example, by depositing the aluminum at a rate of 25 angstroms/sec. to a thickness of 1000 angstroms for each layer of the first six layers, 45, 48, 50, 52, 53 and 54, and 2000 angstroms for the top layer 55. The thickness and composition of top layer 55 are crucial. It has been determined that to obtain a substantially protrusion-free surface after annealing that the top layer must be pure aluminum rather than oxygen-doped aluminum and must be no thinner than about 1,500 angstroms but not thicker than about 3,000 angstroms. In the embodiment now being described, each 1,000 angstrom layer for the first six layers requires 40 seconds each and the top layer of 2000 angstroms requires 80 seconds. Consequently, a seven layer structure 57, as shown in FIG. 2, would require 5 minutes and 20 seconds of deposition time.

The laminated conducting film 57 is then processed in a suitable manner according to the use being made of the aluminum metallization. For example, in order to achieve ohmic contact between the aluminum film and the silicon substrate material in contact-cut areas, it is necessary (for integrated-circuit applications) to heat, if the aluminum is to be annealed, the substrate 13 with the aluminum structure 57 in an annealing chamber at temperatures within the range of approximately 450° C. to approximately about 560° C. This annealing process is typically performed after the metal film has been photolithographically patterned and etched into a configuration of narrow conductor lines which typically terminate at one end in contact cuts and at the other end in bond pads, the bond pads providing external contacts for the integrated circuit through wires to be subsequently bonded to the pads. The result of a metallized structure made according to the present invention is that virtually no protrusions in the form of hillocks or whiskers exceeding 0.5 $\mu$m are formed on the surface 56 of top layer 55 during this annealing process. It is believed that the reason that there is an absence of such protrusions is that the overall strength of the laminated film is sufficiently high to prevent the excessive protrusions from being developed. The exact nature of why such a laminate film is strong is not fully understood. Reference is made to the above-identified article by Springer and Catlett in *Thin Solid Films* for a discussion of the increased strength derived from film lamination. It nevertheless has been demonstrated by the experiments performed to illustrate the present invention that the protrusion effects are minimized sufficiently to render a substantially protrusion-free film that is useful particularly in the integrated circuit art.

In another form of apparatus useful in practicing the invention, the substrate 13 is heated by providing suitable heating elements 60 such as one or more quartz-iodide lamps positioned inside the chamber 10 as shown in FIG. 1.

Figure 4:
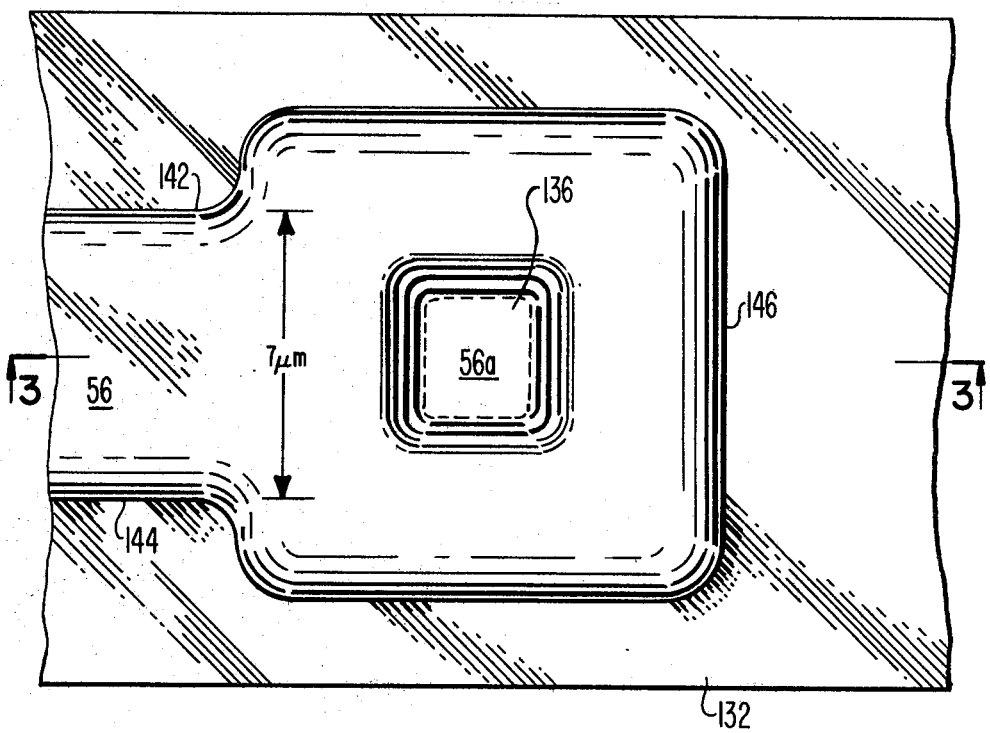
FIG. 4 is a plan view of a portion of FIG. 3.
Figure 3:
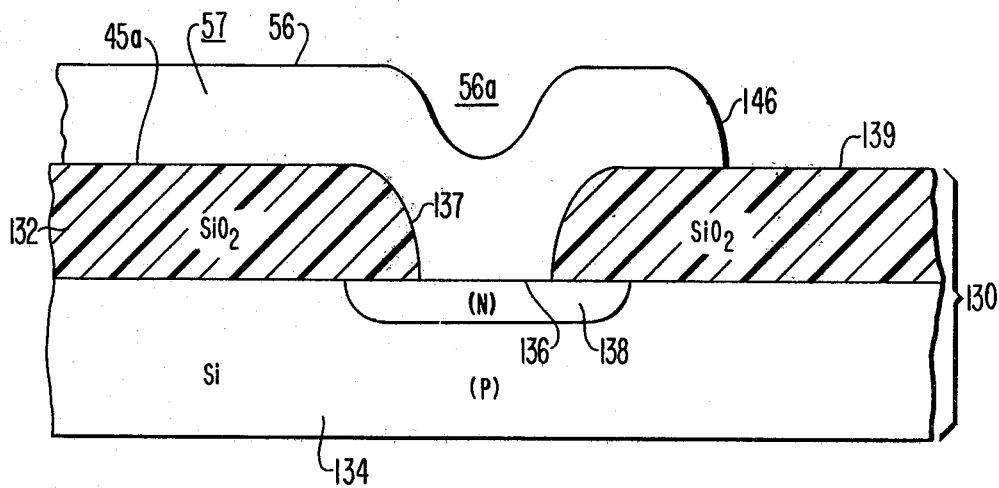
FIG. 3 is a cross-sectional fragmentary view in elevation as seen along viewing line 3—3 of FIG. 4, showing the metallization laminate of the invention formed on an integrated circuit substrate.

To illustrate how the laminated film 57 is applied as used in an integrated circuit environment, reference is made to FIG. 3. In FIG. 3 a substrate 130 is shown formed of a thermally oxidized layer 132 on a silicon substrate 134. A contact-cut portion 137 formed in the silicon dioxide layer 132 by pattern etching is formed to expose surface 136 over the N region 138. The aluminum laminate film 57 (FIG. 2) is formed on the composite surface composed mainly of the silicon dioxide surface 139 but including, as desired, a plurality of contact-cut regions 137. The contour of the laminate 57 is determined by the contour of the surface of the silicon dioxide layer 132 including the cut-out 137 over surface 136. Thus, a depression 56a is developed over the surface 136. After the film laminate 57 is formed on the integrated circuit substrate, the laminated film in FIG. 3 is then patterned to develop a fine-line conductor connected to a contact-cut surface 136 as illustrated in FIG. 4. The top view of the structure shown in FIG. 3 is photolithographically patterned and etched to define the portion of the surface 56 having the edges 142 and 144 and the enlarged peripheral portion 146 over the contact cut region 136. The width of the line portion between edges 142 and 146 is typically 7 micrometers but can range upward or downward from this width. After the photolithographic etching defining the pattern has been completed, the structure is then annealed in forming gas at a temperature in the range of 450°–560° C. during which time the bottom layer of aluminum of the laminate film 57 is alloyed with the surface 136 of the substrate 134 thereby making good ohmic contact between the laminate film 57 and the silicon surface 136. The annealing process also provides some interface development of the region 132 to form a better adherence of the silicon dioxide to the bottom aluminum surface 45a of the laminate 57.

It should be appreciated that, during the process of annealing the laminated film, there is virtually no development of protrusions in the form of hillocks or whiskers as occurs in the art heretofore in which metallization was provided in the form of a single aluminum layer.

In addition to the virtual absence of protrusions on the surface 56 of the aluminum layer 55, the electrical resistance of the aluminum is significantly reduced from higher resistivities of oxygen-doped aluminum films that are not layered with aluminum. The resistivity is the product of the sheet resistance measured by the conventional four-point-probe method and the film thickness measured by conventional profilometer methods. These measurements will have been made prior to the annealing process. The resistivity can be changed as a function of the fill pressure of the process. For example, in one experiment in which the laminated film structure consisted of four cycles of 1000 angstroms Al/1000 angstroms Al-O, topped with 2000 angstroms Al, the resistivities were $3.5 \times 10^{-6}$, $3.9 \times 10^{-6}$ and $4.4 \times 10^{-6}$ ohm-centimeters for separate runs with fill pressures at each layer of $2 \times 10^{-5}$, $5 \times 10^{-5}$ and $8 \times 10^{-5}$ Torr, respectively. Corresponding resistivities for unlayered oxygen-doped aluminum films were $3.7 \times 10^{-6}$, $5.5 \times 10^{-6}$, and $6.3 \times 10^{-6}$ ohm-centimeters. Note that the resistivity of bulk aluminum is approximately $2.7 \times 10^{-6}$ ohm-centimeters. Thus, the layered structures described above have resistivities less than 1.8 times the resistivity of bulk aluminum.

It has been shown by experiment that the topography, that is, the relative smoothness of the surface 56 of the layered structure, is significantly improved with increasing fill pressure, and, consequently, with increasing oxygen concentration. However, such topographical improvement must be balanced against (1) the increase in resistivity that results from increasing fill pressure and (2) furthermore a tendency towards blistering at very high fill pressures, i.e., greater than $10^{-4}$ Torr. Blistering is manifested by portions of the aluminum film 57 separating from the substrate surface 46 (FIG. 2). It is preferred, as demonstrated by many tests of the variables involved, that the optimum fill pressure for layering the aluminum and oxygen-doped aluminum layers is approximately $5 \times 10^{-5}$ Torr. The laminated film resistivity at this preferred fill pressure is only approximately 30 percent higher than that of pure aluminum film and is approximately equal to that of the conventional aluminum-silicon (Al-Si) film.

Several examples of experiments will now be given illustrating different ways in which the invention can be practiced.

Topographies and resistivities of laminated films made according to the invention are compared to reference or control films made according to conventional practice. Films were deposited to an overall thickness of approximately 10,000 angstroms either in an Airco Temescal Model FC 1800 E-beam deposition system at a deposition rate of 25 angstoms per second, or in a Varian Model 3120 S-Gun (magnetron sputtering) deposition system at a deposition rate of 4 angstroms per second. The films, which were deposited on thermally oxidized silicon wafers, were patterned into arrays of 100 $\mu$m $\times$ 100 $\mu$m bond pads and 7 $\mu$m-wide lines, and subsequently annealed in forming gas at 530° C. for 20 minutes. Post-anneal film topography was determined by Scanning Electron Microscopy (SEM).

Control Films:

For a 10,000 angstrom single-layer aluminum film deposited in the E-beam system, film resistivity was $3.0 \times 10^{-6}$ $\Omega$-cm, and post-anneal hillock density on bond pads for hillocks approximately 1 $\mu$m in height was approximately $2 \times 10^5$ cm$^{-2}$. For a single-layer film deposited in the S-Gun system, film resistivity was $3.4 \times 10^{-6}$ $\Omega$-cm. Post anneal hillock density on bond pads for hillocks approximately 1 $\mu$m in height was approximately $4 \times 10^4$ cm$^{-2}$; and, for hillocks between 0.5 and 0.7 $\mu$m in height, was approximately $8 \times 10^4$ cm$^{-2}$. Hillock heights and densities were roughly the same on 7 $\mu$m lines as on the bond pads.

Laminated Films:

EXAMPLES I (E-Beam)

For laminated films deposited in the E-beam system the following results were obtained as the oxygen-fill pressure was varied:

(a) For an oxygen fill pressure of $2 \times 10^{-5}$ Torr the oxygen concentration in oxygen-doped layers was approximately 1.5 atomic percent, and film resistivity was $3.5 \times 10^{-6}$ $\Omega$-cm. There were no hillocks with a height greater than approximately 0.5 $\mu$m. Hillock density on bond pads for heights between 0.3 and 0.5 $\mu$m was approximately $5 \times 10^4$ cm$^{-2}$.

(b) For an oxygen fill pressure of $5 \times 10^{-5}$ Torr the oxygen concentratin in oxygen-doped layers was approximately 3.5 atomic percent, and film resistivity was $3.9 \times 10^{-6}$ $\Omega$-cm. There were no hillocks with heights greater than 0.3 $\mu$m.

(c) For an oxygen fill pressure of $8 \times 10^{-5}$ Torr the oxygen concentration in oxygen-doped layers was approximately 6 atomic percent, and film resistivity was $4.4 \times 10^{-6}$ $\Omega$-cm. There were no hillocks with heights greater than 0.3 $\mu$m.

For examples I (a) to I (c) hillock heights and densities on 7 $\mu$m lines were roughly the same as on bond pads. The layering structure of these films consisted of four cycles of 1000 angstroms Al/1000 angstroms Al-O topped by 2000 angstroms Al, totalling, thus, 10,000 angstroms.

EXAMPLE II (Magnetron Sputterer)

For a laminated film deposited in the S-Gun magnetron sputtering system with the same layering structure as the films given in Example I, and with approximately 8.2 atomic percent oxygen in the oxygen-doped layers, there were no hillocks with heights greater than 0.5 $\mu$m on bond pads or 7 $\mu$m lines, and the hillock density for heights between 0.3 and 0.5 $\mu$m was approximately $3 \times 10^4$ cm$^{-2}$. The resistivity of this film was $4.8 \times 10^{-6}$ $\Omega$-cm.

EXAMPLE III (Magnetron Sputterer)

For a laminated film deposited in the S-Gun system with the following layering structure: 1000 angstroms Al, followed by six cycles of 200 angstroms Al-O/800 angstroms Al, followed by 200 angstroms Al-O, and topped with 2800 angstroms Al; in which the oxygen concentration in the oxygen-doped layers was approximately 8.2 atomic percent; the film resistivity was $4.2 \times 10^{-6}$ Ω-cm. There were no hillocks with height greater than approximately 0.5 μm on bond pads or 7 μm lines, and the hillock density for heights between 0.3 and 0.5 μm was approximately $5 \times 10^6$ cm$^{-2}$.

EXAMPLE IV (E-beam)

For a 10,000 angstrom laminated film deposited in the E-beam system, with the following layering structure: 1000 angstroms Al, followed by 400 angstroms Al-O, followed by four cycles of 1600 angstroms Al/400 angstroms Al-O, topped with 1600 angstroms Al; in which the oxygen concentration in the oxygen-doped layers was approximately 7.4 atomic percent, the film resistivity was $3.8 \times 10^{-6}$ Ω-cm. The 100 μm × 100 μm bond pads on this film had a hillock density for a height of 1 μm of approximately $4 \times 10^4$ cm$^{-2}$. However, 7 μm lines had no hillocks with heights greater than approximately 0.5 μm. Thus, for this layered structure, in which the Al-O layers were only one fourth the thickness of the Al layers, hillock growth was suppressed on fine-line (7 μm) features, but not on large (100 μm × 100 μm) patterned areas.

Further examples of laminated films not to be described in detail were made in thicknesses between 8000 to 12,000 angstroms. It is expected that thicknesses up to 25,000 angstroms can be made with good topography and acceptable resistivity for integrated circuit applications and line resistance values. In practice the line resistance useful for integrated circuits dictates a film thickness on the order of 10,000 angstroms. The invention is not, however, limited to such film thicknesses.

In practicing the invention utilizing resistance heated filaments or rf heated crucibles to evaporate aluminum, the steps are performed substantially as described above in the use of E-beam and magnetron sputtering deposition systems. When resistance heated filaments are used to evaporate the aluminum, the aluminum-atom flux incident on the substrates corresponds to aluminum deposition rates ranging from about 20 to 50 angstroms/sec. When the aluminum is evaporated from a crucible heated by an rf energized coil, the deposition rate of aluminum ranges also from about 20 to 50 angstroms/sec.

While the embodiments described utilize a substrate formed of silicon, other substrate compositions may be used in the practice of the invention. Thus, substrate material known to be compatible with aluminum, such as sapphire ($Al_2O_3$), and gallium arsenide (GaAs), can be used for the invention.

Films were tested comprising a single layer of oxygen-doped aluminum film deposited to thicknesses corresponding to the composite thickness of a laminated film made according to this invention.

These single-layered oxygen-doped films had protrusions of either height or density that were more severe than the protrusions that develop on pure aluminum films, and accordingly, the topography of such tested films were unacceptable for integrated circuit purposes. Bhatt, in his article cited above, reported that either no hillocks or a small number of short hillocks were formed on single-layered aluminum films containing $Al_2O_3$. However, many repeated experiments on single-layered, oxygen-doped aluminum films performed preliminary to the present invention, resulted either in unsatisfactory topography or in unsatisfactorily high resistivity for integrated circuits.

More particularly, such oxygen-doped aluminum films deposited with fill pressures of $5 \times 10^{-5}$ Torr and lower displayed protrusions, particularly in the form of whiskers, of such large size, i.e., greater than 1 μm, and re-entrant shaped (i.e., "mushroom" shape), as to provide greater obstacles to PSG and photoresist coverage that hillocks that are typically formed by annealing on pure aluminum film. Moreover, the film resistivity of such single-layered oxygen-doped films (at about $5 \times 10^{-5}$ Torr fill pressure) were about $5.5 \times 10^{-6}$ Ω-cm, i.e., significantly higher than the $3.9 \times 10^{-6}$ Ω-cm resistivity of the layered films (example Ib) deposited at $5 \times 10^{-5}$ fill pressure. At high oxygen pressures ($8 \times 10^{-5}$ Torr) blistering started to develop in the unlayered films and the resistivity was still higher, i.e., $6.3 \times 10^{-6}$ Ω-cm.

What is claimed is:

1. A method of forming by deposition a laminated conducting film on an integrated circuit substance in a vacuum chamber comprising the steps of:
    depositing aluminum on the substrate;
    periodically introducing dry oxygen into the chamber while depositing the aluminum to provide a laminated film of alternate layers of aluminum and oxygen-doped aluminum, the oxygen-doped layers of aluminum having less than 10 atomic percent oxygen; and
    interrupting the flow of oxygen to form the top layer of aluminum to a thickness of no less than about 1,500 angstroms and no more than about 3,000 angstroms;
    the laminated film having a composite thickness in the range of 8000–25,000 angstroms.

2. The method of claim 1 wherein the oxygen-doped layers comprise aggregate thicknesses of 10–50 percent of the composite thickness of the laminated film.

3. The method of claim 2 comprising introducing the dry oxygen to an oxygen fill pressure of $5 \times 10^{-6}$ to $1 \times 10^{-4}$ Torr to develop respectively a flow rate of approximately $2 \times 10^{17}$ to $3 \times 10^{18}$ molecules of oxygen per second.

4. The method of claim 3 comprising depositing odd-numbered aluminum layers each layer having thicknesses of about 1,000 angstroms, and alternately depositing even-numbered layers of oxygen-doped aluminum each layer having a thickness of about 1,000 angstroms, whereby a minimum of three odd-numbered layers of aluminum and three even-numbered alternating layers of oxygen-doped aluminum are deposited.

5. The method of claim 1 wherein the vacuum deposition of aluminum is done by an electron beam evaporator and further comprising the step of depositing the aluminum in the range of approximately 25 angstroms per second to 50 angstroms per second.

6. The method of claim 1 wherein the deposition of aluminum is done by a magnetron sputterer and wherein the step of depositing the aluminum is done at a rate of about 4 angstroms per second.

7. The method of claim 1 wherein the deposition of aluminum is done by a filamentary evaporator providing high energy aluminum-atom flux incident to the substrates and wherein the step of depositing aluminum is done at rates ranging from about 20 to 50 angstroms per second.

8. The method of claim 1 wherein the deposition of aluminum is done by evaporating the aluminum from a crucible of aluminum heated by an RF coil and wherein the step of depositing the aluminum is done at rates ranging from about 20 to 50 angstroms pr second.

9. The method of claims 1 or 2 further comprising the step of depositing the top layer of the film solely with aluminum to a thickness of at least about 1500 angstroms but not greater than about 3000 angstroms.

10. The method of claims 1 or 2 further comprising the step of depositing the initial layer of the film on said substrate solely with aluminum to a thickness no more than about 2000 angstroms.

11. The method of claims 1 or 2 further comprising the step of heating said substrate to a temperature of about 250° C. while depositing the aluminum.

12. The method according to claims 1 or 2 further comprising the step of providing a desired integrated circuit photoresist pattern on the surface of the laminated film, and etching the film away in areas free of photoresist to leave a desired conducting circuit interconnection pattern.

13. The method according to claims 1, or 2 further comprising the step of annealing the laminated film at a temperature within the range of 450° C. to 560° C.

14. A metallized integrated circuit device made in accordance with the method recited in claim 12.

15. A metallized integrated circuit device made in accordance with the method recited in claim 13.

* * * * *

UNITED STATES PATENT AND TRADEMARK OFFICE
CERTIFICATE OF CORRECTION

PATENT NO. : 4,302,498

DATED : November 24, 1981

INVENTOR(S) : Thomas John Faith, Jr.

It is certified that error appears in the above-identified patent and that said Letters Patent is hereby corrected as shown below:

On The Title Page,
In the Abstract, line 12, delete the word "as".

Column 1, line 10, change "film" to --films--.

Column 1, line 26, change "expression" to --expansion--.

Column 1, line 49, change "hard-backing" to --hard-baking--.

Column 2, lines 33 and 34, change "des-position" to --deposition--.

Column 3, line 59, after "deposition" insert --system--.

Column 8, line 37, change "concentratin" to --concentration--.

Column 10, line 21, change "substance" to --substrate--.

Column 11, line 3, change "pr" to --per--.

Signed and Sealed this

Twenty-sixth Day of October 1982

[SEAL]

Attest:

Attesting Officer

GERALD J. MOSSINGHOFF

Commissioner of Patents and Trademarks